(12) United States Patent
Ochi

(10) Patent No.: US 7,567,615 B2
(45) Date of Patent: Jul. 28, 2009

(54) ADAPTIVE EQUALIZATION CIRCUIT AND ADAPTIVE EQUALIZATION METHOD

(75) Inventor: Hirotaka Ochi, Saijyo (JP)

(73) Assignee: Panasonic Corporation, Osaka (JP)

( * ) Notice: Subject to any disclaimer, the term of this patent is extended or adjusted under 35 U.S.C. 154(b) by 638 days.

(21) Appl. No.: 10/536,719

(22) PCT Filed: Dec. 2, 2003

(86) PCT No.: PCT/JP03/15378

§ 371 (c)(1),
(2), (4) Date: May 27, 2005

(87) PCT Pub. No.: WO2004/051648

PCT Pub. Date: Jun. 17, 2004

(65) Prior Publication Data

US 2006/0072379 A1    Apr. 6, 2006

(30) Foreign Application Priority Data

Dec. 2, 2002   (JP) .............................. 2002-349683

(51) Int. Cl.
*H03H 7/30* (2006.01)
*H03H 7/40* (2006.01)
*H03K 5/159* (2006.01)

(52) U.S. Cl. .................. 375/232; 375/233; 375/229
(58) Field of Classification Search .............. 369/30.01, 369/24.01; 375/229, 232, 230
See application file for complete search history.

(56) References Cited

U.S. PATENT DOCUMENTS

| 6,246,864 B1* | 6/2001 | Koike ........................ 455/110 |
| 2002/0067677 A1* | 6/2002 | Miyashita et al. ......... 369/59.16 |
| 2003/0156603 A1* | 8/2003 | Rakib et al. ................. 370/485 |

FOREIGN PATENT DOCUMENTS

| JP | 03137871 | 6/1991 |
| JP | 10027435 | 1/1998 |
| JP | 10303760 | 11/1998 |
| JP | 11345460 | 12/1999 |
| JP | 2001184795 | 7/2001 |
| JP | 2001195830 | 7/2001 |
| JP | 2002216422 | 8/2002 |
| JP | 2002269925 | 9/2002 |

* cited by examiner

Primary Examiner—David C Payne
Assistant Examiner—Brian J Stevens
(74) Attorney, Agent, or Firm—Steptoe & Johnson LLP

(57) ABSTRACT

The present invention provides an adaptive equalization circuit and adaptive equalization method that can perform signal processing on a small scale with good computation accuracy, and can improve the reproducing signal quality and improve the playability of abnormal signals. According to the present invention, an equalization target value (true target value) in the sampling frequency area is determined by the equalization target value generation means (104) from the signals in the resampling frequency area after phase synchronization is performed, and the tap factors of the pre-digital equalization means (102) can be adaptively computed from this equalization target value and the input/output signals of the pre-digital equalization means (102).

7 Claims, 11 Drawing Sheets (a) SIGNAL EQUALIZED TO EPR4
NOISE (INCLUDING EQUALIZATION ERROR) EXISTS (b) ESTIMATION OF EQUALIZATION
TARGET VALUE BY THRESHOLD

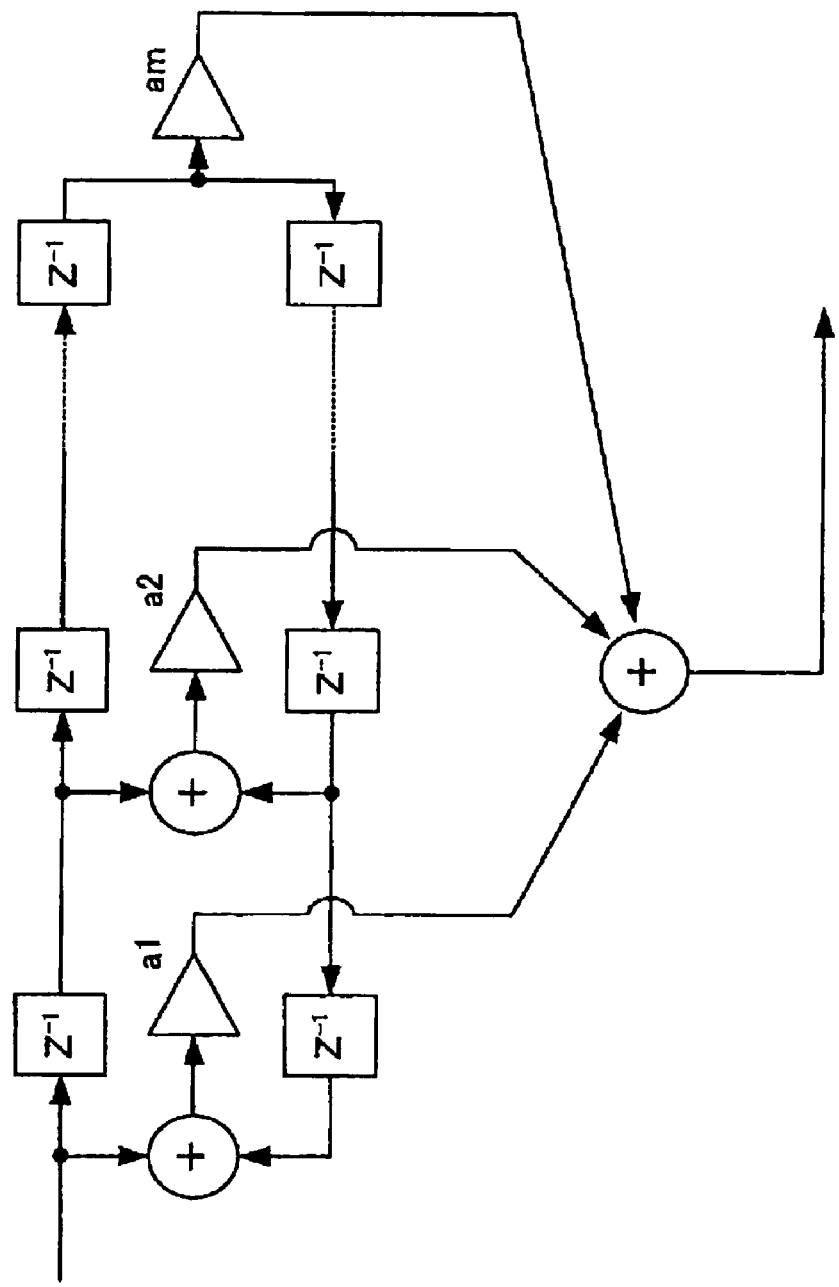
F I G. 3

FIG. 5

| | COE(1) | COE(2) | COE(3) | COE(4) | COE(5) | COE(6) | COE(7) | COE(8) |
|---|---|---|---|---|---|---|---|---|
| h | COE(9) | COE(10) | COE(11) | COE(12) | COE(13) | COE(14) | COE(15) | |

| h1(−1) | 0.0017 | −0.0038 | 0.0083 | −0.0162 | 0.0299 | −0.0562 | 0.1350 | 0.9739 |
| | −0.1028 | 0.0475 | −0.0257 | 0.0138 | −0.0069 | 0.0031 | −0.0015 | |

→

| h1(−2) | 0.0049 | −0.0112 | 0.0239 | −0.0458 | 0.0839 | −0.1624 | 0.4632 | 0.7798 |
| | −0.1980 | 0.0979 | −0.0533 | 0.0283 | −0.0137 | 0.0060 | −0.0032 | |

→

| h2(−1) | −0.0015 | 0.0031 | −0.0069 | 0.0138 | −0.0257 | 0.0475 | −0.1028 | 0.9739 |
| | 0.1350 | −0.0562 | 0.0299 | −0.0162 | 0.0083 | −0.0038 | 0.0017 | |

| h2(−2) | −0.0032 | 0.0060 | −0.0137 | 0.0283 | −0.0533 | 0.0979 | −0.1980 | 0.7798 |
| | 0.4632 | −0.1624 | 0.0839 | −0.0458 | 0.0239 | −0.0112 | 0.0049 | |

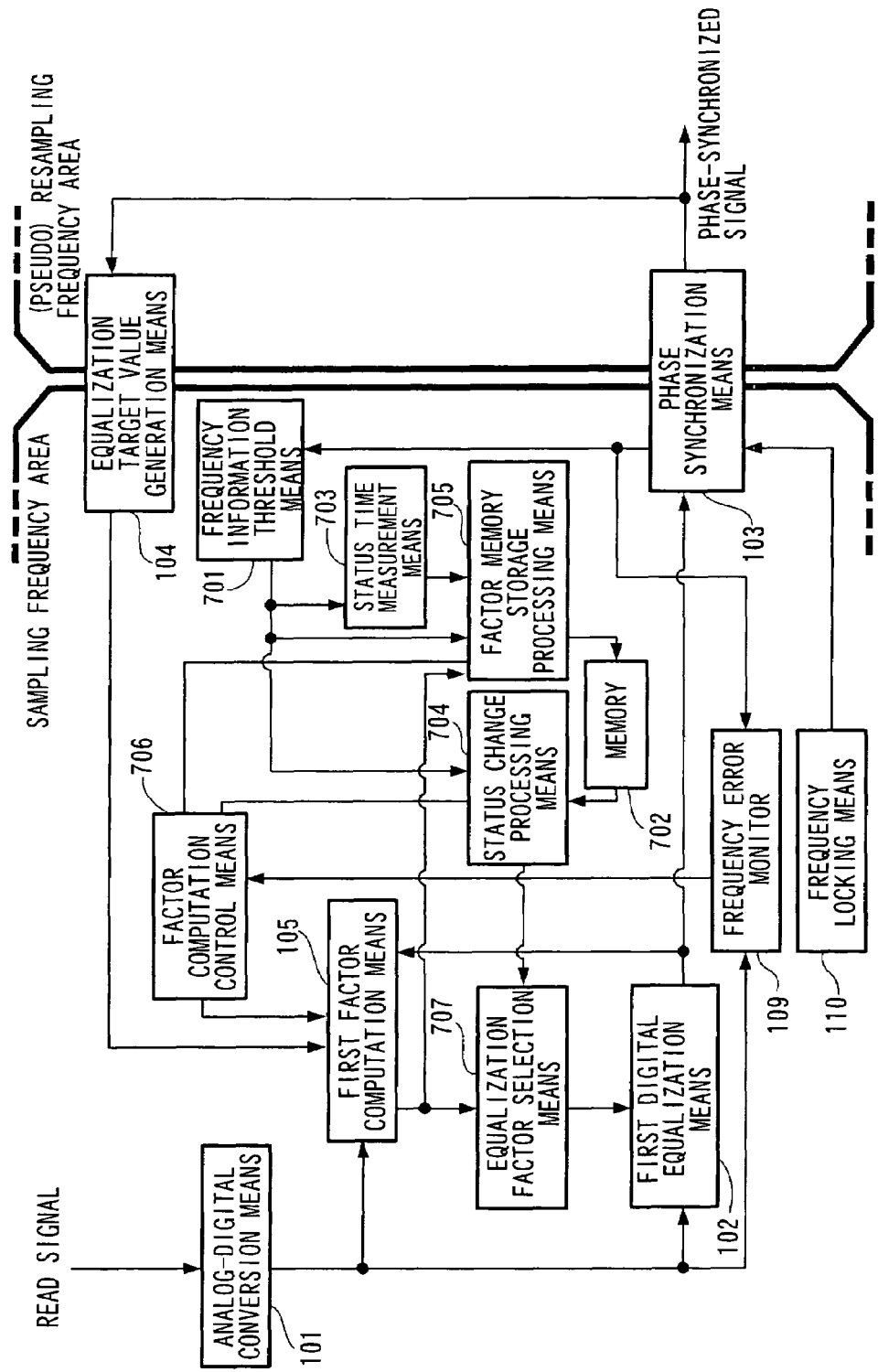
F I G. 7

ADAPTIVE EQUALIZATION CIRCUIT AND ADAPTIVE EQUALIZATION METHOD

The present application is based on PCT Application No. PCT/JP03/15378, filed Dec. 2, 2003, which application is incorporated herein by reference in its entirety.

TECHNICAL FIELD

The present invention relates to adaptive equalization, characterized in that the reproduced digital quality and the follow up performance of a PLL (Phase Locked Loop) are improved by adapting the pre-equalization, and effective equalization can be implemented particularly when the frequency of the reproducing data changes.

BACKGROUND ART

Recently the storage capacity of a magnetic recording/reproducing unit or optical recording/reproducing unit is rapidly increasing as the information volume to be handled increases, therefore it is necessary to increase recording density. However the increase of recording density deteriorates the data quality, so recently a system called the PRML (Partial Response Maximum Likelihood) signal processing method is used to guarantee reliability. This system has a high reproducing performance even for high density recording/reproducing waveforms. The PRML signal processing method is a method for improving the error rate of the reproducing data in a reproducing system, in which the amplitude of the high frequency component of the signal deteriorates and the signal-noise ratio increases as the recording density in the line recording direction increases, and by also using the maximum likelihood decoding method, which makes it unnecessary to use a high frequency component in the reproducing signals by intentionally adding waveform interference, and which demodulates the most likely series by probability calculation considering the waveform interference.

PR of the PRML signal processing method is for intentionally adding waveform interference, and is a processing that filters so as to match the PR type of the system. The configuration that is often used for equalization (filtering) to the PR type is that after pre-equalization with an analog filter, further adjustment is made by a post-digital adaptive filter. However equalization to the PR by the analog filter may shift due to an irregularity of the recording medium. The post-digital adaptive filter decreases the influence by the equalization shift of the pre-equalization by adaptive equalization.

ML of the PRML signal processing method is a maximum likelihood signal, of which characteristic can be improved when there is a correlation among the decoder input signal series, and which is used for decoding the most likely data. In PRML, the characteristic is improved by PR since there is a correlation among the decoder input signal series. The above ML is a synchronization circuit, so clock signals synchronizing with the reproducing signals are required. In the reproducing signal of the disk device, however, the frequency changes somewhat because of an unevenness of the rotation of the spindle motor. To follow up this change, a circuit called a PLL (Phase Locked Loop) is required.

Among those systems using the PRML signal processing method and PLL, a system using a digital PLL, based on interpolation, is currently on the market. If this system is used, the number of analog components can be decreased. Also the analog-digital converter is not in the PLL loop, so the loop delay of the PLL does not increase even if a pre-filter is inserted between the analog-digital converter and the PLL, and performance can be improved. Since the analog component of a PLL is unnecessary, and a system can be constructed by almost all digital circuits, the irregularity problem of analog circuits can be solved (e.g. JP10-27435A, pages 4-7, see FIG. 1).

In the system using the digital PLL, the pre-filter is constructed by a digital filter, so the characteristic of the digital filter can be freely changed by setting the factor thereof. Therefore the reproducing signal at the point of pre-equalization can have the desired frequency characteristic, and the frequency characteristic at which the performance of the PLL is the maximum can be implemented in the pre-stage of the PLL.

FIG. 8 shows a configuration example for implementing the adaptation of this pre-filter. The adaptation is performed as follows. In FIG. 8, the digital PLL using interpolation is the phase synchronization means 103. Using this phase synchronization means 103, the input/output signals of the first digital equalization means 102, that is the pre-filter, are both resampled and phases thereof are synchronized. The output signals of the first digital equalization means 102 are resampled by the first interpolation means 1031, and the input signals of the first digital equalization means 102 passes through a "delay", and are resampled by the A/D conversion information interpolation means 801. Using these resampled input/output signals of the first digital equalization means 102, the tap factors of the first digital equalization means 102 are computed by the temporary factor computation means 802. Here the first digital equalization means 102 and the temporary factor computation means 802 are the computation means that operate at a different frequency, at frequency A and frequency B for example, so the tap factors acquired by the temporary factor computation means 802 are fed back to the first digital equalization means 102 via the rate converter 803, that converts the frequency. By using this rate converter 803, the adaptive control of the pre-filter becomes possible (e.g. JP2001-184795A, pages 6-9, see FIG. 1).

However in the case of the above system, if the difference of the sampling frequency of the analog-digital converter and the resampling frequency of the PLL is large, the burden on the rate converter 803, which converts the rate of the tap factors, is high, and high order interpolation is required onboard the rate converter 803 to maintain performance, which makes the circuit scale large.

For example, if the data is read from a disk medium where the data is recorded with a constant line recording density by a CAV (Constant Angular Velocity) method, the data frequencies to be read are quite different between the inner tracks and outer tracks. But in the case of the above mentioned system using the digital PLL, the sampling frequency of the analog-digital converter is fairly constant. The digital PLL executes resampling so as to roughly synchronize with the data frequency. In the case of this example, the ratio of the sampling frequency of the analog-digital converter and the resampling frequency of the PLL changes in the range of double or more, so the rate converter 803 requires a performance which can sustain these changes.

Also in this system, the sampling frequency of the analog-digital converter is higher than the resampling frequency of the PLL. In digital signal processing, the accuracy of the computation improves as computation is performed at a higher frequency, but the tap factor computation of the pre-filter is performed at a low frequency, that is with the signals after resampling, so computation accuracy cannot be improved.

DISCLOSURE OF INVENTION

To solve the above problems, an adaptive equalization circuit of the present invention comprises analog-digital conversion means for sampling signals read from a recording medium, first digital equalization means for equalizing waveforms of analog-digital conversion information that are output from the analog-digital conversion means, phase synchronization means for synchronizing the phase for signals equalized by the first digital equalization means, equalization target value generation means for generating an equalization target value of the first digital equalization means from the signals of which phases are synchronized by the phase synchronization means, and first factor computation means for computing tap factors of the first digital equalization means from the analog-digital conversion information, the signals equalized by the first digital equalization means, and the equalization target values, and since the tap factors are computed with a frequency before resampling (sampling frequency of the analog-digital converter), the rate converter is unnecessary, and since computation is performed with a frequency higher than the frequency after resampling, computation accuracy can be improved, and the circuit scale, when implemented as hardware, can be decreased.

The first aspect of the present invention is an adaptive equalization circuit, comprising analog-digital conversion means for sampling signals read from a recording medium, first digital equalization means for equalizing the waveforms of output from the analog-digital conversion means, phase synchronization means for synchronizing the phases for signals equalized by the first digital equalization means, equalization target value generation means for generating equalization target values of the first digital equalization means from the signals of which phases are synchronized by the phase synchronization means, and first factor computation means for computing tap factors of the first digital equalization means from the output of the analog-digital conversion means, the signals equalized by the first digital equalization means and the equalization target value, and since the tap factors are computed with a frequency before resampling, the rate converter is unnecessary, and since computation is performed with a frequency higher than the frequency after resampling, the computation accuracy can be improved, and the circuit scale, when implemented as hardware, can be decreased.

According to the adaptive equalization circuit of the first aspect of the present invention, the rate conversion of the tap factors is unnecessary, therefore a small scale can be implemented and signal processing can be performed with a frequency higher than the resampling frequency, even if the difference between the sampling frequency of the analog-digital converter and the resampling frequency of the PLL changes, so adaptive control of the equalization means utilizing bands efficiently can be implemented, the reproducing signal quality can be improved, and the playability of abnormal signals can be improved.

The second aspect of the invention is the adaptive equalization circuit according to the first aspect of the invention, wherein the equalization target value generation means further comprises temporary target value generation means for generating a temporary target value, that is the equalization target value of the phase-synchronized signals, and equalization target phase rotation means for generating a true target value, that is an equalization target value before synchronizing phases by the phase synchronization means from the temporary target value, and the equalization target value can be easily generated merely by the equalization target phase rotation means rotating the phase of the temporary target value.

According to the adaptive equalization circuit of the second aspect of the invention, the equalization target value is determined by the signals after the phase synchronization, so reliability is high, and immediately after this, the frequency is converted into the frequency before the phase synchronization for computation, and signal processing is performed, so adaptive control of equalization means can be performed utilizing the band efficiently.

The third aspect of the invention is the adaptive equalization circuit according to the first and second aspects of the invention, wherein the first digital equalization means is an FIR filter of which tap factors are a symmetric type, and since phase control is performed by the first digital equalization means, the contention of the phase synchronization loop and adaptive equalization loop can be prevented.

According to the adaptive equalization circuit of the third aspect of the invention, the tap factors of the FIR filter for equalization are a symmetric type, so the scale can be decreased, and the contention of phase control with phase synchronization can be prevented.

The fourth aspect of the invention is the adaptive equalization circuit according to the first aspect of the invention, further comprising second digital equalization means for inputting signals of which the phases are synchronized by the phase synchronization means and performing adaptive equalization, and second factor computation means for computing the tap factor of the second digital equalization means from the signals of which phases are synchronized by the phase synchronization means and the signals equalized by the second digital equalization means, and by having both pre- and post-equalization means, the reproducing signal quality can be further improved.

According to the adaptive equalization circuit of the fourth aspect of the invention, post-digital adaptive equalization is performed after the phase synchronization, so equalization can be further adjusted, and the reproducing signal quality is improved.

The fifth aspect of the invention is the adaptive equalization circuit according to the fourth aspect of the invention, wherein the second digital equalization means is an FIR filter of which the tap factors are an asymmetric type, and since the second digital equalization means also controls phases, correction is possible even if the reproducing signals have passed through a transmission path of which the group delay characteristic is not flat.

According to the adaptive equalization circuit of the fifth aspect of the invention, the tap factors of the FIR filter, which performs post-digital adaptive equalization after the phase synchronization, are an asymmetric type, so the group delay characteristic can be corrected, and the reproducing signal quality is improved.

The sixth aspect of the invention is the adaptive equalization circuit according to the second aspect of the invention, wherein the phase synchronization means is a phase synchronization loop further comprising first interpolation means for interpolating signals equalized by the first digital equalization means, and interpolation position computation means for computing an interpolation position of the first interpolation means from the output of the first interpolation means, and the equalization target phase rotation means is the second interpolation means for interpolating the temporary target value and acquiring the true target value, and the interpolation position of the second interpolation means is computed by the interpolation position computation means, and the equalization target phase rotation means is the second interpolation means for interpolating the temporary target value and acquiring the true target value, and the interpolation position of the second interpolation means is computed by the interpolation position computation means or the second interpolation position computation means having the same functions, and both the signals when the phases of the signals equalized by the first digital equalization means slide, and signals when the phase of the temporary target value slides can easily be determined by using interpolation.

According to the adaptive equalization circuit according to the sixth aspect of the invention, phase synchronization is performed by interpolation, and the phase conversion of the equalization target value is also performed by interpolation, and these two interpolations can be performed by the control of the interpolation position computation means, which are identical, or have identical functions, so the scale can be decreased and implementation is simplified.

The seventh aspect of the invention is the adaptive equalization circuit according to Claim 6, wherein the first interpolation means and second interpolation means are FIR filters, the interpolation position computation means outputs tap factors as information of the interpolation position, and if each tap factor, when n is the number of taps, is COE(n), then the tap factor h1, to be supplied to the first interpolation means is given by h1={COE(1) COE(2) COE(3) - - - COE(n)}, and when the number of taps of the second interpolation means is the same as the number of taps of the first interpolation means, the tap factor h2, to be supplied to the second interpolation means, has a symmetrical relationship with h1, and is given by h2={COE(n) COE(n−1) COE(n−2) - - - COE(1)}, or this factor, h2, is delayed and input to the second interpolation means, and when the number of taps of the second interpolation means is different from the number of taps of the first interpolation means, h3, that is a factor having a phase characteristic equivalent to h1, is given by h3={COE(1) COE(2) COE(3) - - - COE(m)}, where m is the number of taps, is provided, and the tap factor h4, to be supplied to the second interpolation means, which has a symmetric relationship with h3, is given by h4={COE(m) COE(m−1) COE(m−2) - - - COE(1)}, or this factor, h4, is delayed and input to the second interpolation means, so both signals equalized by the first digital equalization means and the signal of the temporary target value can be interpolated merely by inverting the tap factor, without installing any special means.

According to the adaptive equalization circuit of the seventh aspect of the invention, the above mentioned two interpolation means are FIR filters, and when the interpolation position computation means outputs the tap factors as information on the interpolation position, the factors of both interpolation filters are set as the above mentioned formula, so the scale is decreased and implementation is simplified.

The eighth aspect of the invention is the adaptive equalization circuit according to the third aspect of the invention, wherein even if the phase synchronization performed by the phase synchronization means is in unlock status, the first factor computation means supplies the computed tap factors to the first digital equalization means, and performs adaptive equalization, and since the first digital equalization means is a symmetric type and does not perform phase control, deterioration of locking of the PLL, caused by an equalization shift, can be prevented.

According to the adaptive equalization circuit of the seventh aspect of the invention, adaptive control of the equalization means is started even if the phase synchronization is in unlock status, so deterioration of the locking performance of the PLL caused by an equalization shift can be improved, the reproducing signal quality can be improved, and the playability of abnormal signals can be improved.

The ninth aspect of the invention is the adaptive equalization circuit according to the third and sixth aspects of the invention, further comprising a frequency error monitor for monitoring frequency errors of phase synchronization performed by the phase synchronization means, wherein when a frequency error is smaller than a predetermined value, the first factor computation means supplies the computed tap factors to the first digital equalization means and starts adaptive equalization, and since the first digital equalization means is a symmetric type and does not perform phase control, adaptive equalization can be started if a frequency error is small, without diverging from control, and the deterioration of locking of the PLL caused by an equalization shift can be prevented.

According to the adaptive equalization circuit of the ninth aspect of the invention, the frequency error monitor for monitoring frequency errors of phase synchronization is provided, and adaptive equalization of the equalization means is started when a frequency error detected by this frequency error monitor becomes smaller than an arbitrary set value, so the deterioration of the locking performance of the PLL caused by an equalization shift can be improved without diverging adaptive equalization control, the reproducing signal quality can be improved, and the playability of abnormal signals can be improved.

The tenth aspect of the invention is the adaptive equalization circuit according to the ninth aspect of the invention, further comprising frequency locking means for changing the frequency information to be used for computation by the interpolation position computation means so as to decrease a frequency error detected by the frequency error monitor, and frequency locking by the frequency locking means makes it possible to start and perform adaptive equalization without divergence of a frequency error is small, so the deterioration of the locking of the PLL caused by an equalization shift can be prevented.

According to the adaptive equalization circuit according to Claim 10, the frequency locking means 110 is provided separately from the phase synchronization means, so the locking performing of the PLL is improved, by which the equalization performance is improved, and by which the locking performance of the PLL is further improved. The loop becomes one which allows a good performance improvement, the deterioration of the locking performance of the PLL caused by an equalization shift is improved, the reproducing signal quality can be improved, and the playability of abnormal signals can be improved.

The eleventh aspect of the invention is an adaptive equalization method for equalizing signals read from a recording medium to a desired characteristic, comprising the steps of sampling the read signals, equalizing waveforms for the sampled signals, performing phase synchronization for the waveform-equalized signals, generating equalization target values of the waveform equalization from the phase-synchronized signals, and computing tap factors for the waveform equalization from the sampled signals, the waveform-equalized signals and the equalization target values, and since the tap factors are computed with a frequency before resampling, the rate converter is unnecessary, and since computation is performed with a frequency higher than the frequency after resampling, computation accuracy can be improved.

According to the adaptive equalization method of the eleventh aspect of the invention, rate conversion of the tap factors is unnecessary, therefore even if the difference between the sampling frequency and the resampling frequency of the PLL changes, small scale signal processing with high frequency is possible, so equalization adaptive control utilizing the band efficiently can be performed, the reproducing signal quality can be improved, and the playability of abnormal signals can be improved.

The twelfth aspect of the invention is an adaptive equalization method for equalizing signals read from a recording medium to a desired characteristic, comprising the steps of sampling the read signals, equalizing waveforms for the sampled signals, performing phase synchronization for the waveform-equalized signals, generating a target value that is an equalization target value of phase-synchronized signals, generating a true target value, that is an equalization target value before performing phase synchronization, from the temporary target value, and computing tap factors for the waveform equalization from the sampled signals, the waveform-equalized signals and the true target value, and since the tap factors are computed with a frequency before resampling, the rate conversion is unnecessary, and since computation is performed with a frequency higher than the frequency after resampling, computation accuracy can be improved, and the true target value can be easily generated after the temporary target value is determined.

According to the adaptive equalization method of the twelfth aspect of the invention, the equalization target value is determined with the signals after phase synchronization, so reliability is high, and then the frequency is immediately converted into the frequency before phase synchronization, and signal processing is performed, so adaptive control of the equalization means can be performed utilizing the band efficiently.

The thirteenth aspect of the invention is the adaptive equalization circuit according to Claim 1, further comprising frequency information threshold means for judging the frequency information of the phase synchronization means in a plurality of statuses using one or more threshold values, a memory for storing tap factors corresponding to the statuses judged by the frequency information threshold means, equalization factor selection means for selecting either the output of the first factor computation means or of the memory when tap factors are supplied to the first digital equalization means, status time measurement means for measuring the duration of the status out of the statuses judged by the frequency information threshold means and comparing it with a predetermined value, factor computation control means for controlling the starting or stopping of the computation of the first factor computation means, factor memory storage processing means for transferring an instruction to stop computation by the first factor computation means to the factor computation control means if the duration is longer than the predetermined value in the status time measurement means, and storing the tap factors after the factor computation means stops to a position corresponding to the status judged by the frequency information threshold means of the memory, and status change processing means for switching the equalization factor selection means so as to supply the tap factor to the first digital equalization means and notifying the factor computation control means that computation, by the first factor computation means, is stopped if the tap factor corresponding to the status after change is stored in the memory when the status judged by the frequency information threshold means changes, and for switching the equalization factor selection means so as to supply the tap factor, that is the computation result of the first factor computation means, to the first digital equalization means and notifying the factor computation control means that the factor computation by the first factor computation means is started if the tap factor corresponding to the status after change is not stored in the memory.

The fourteenth aspect of the invention is an adaptive equalization circuit, comprising analog-digital conversion means for sampling signals read from a recording medium, first digital equalization means for equalizing the waveform of output of the analog-digital conversion means, phase synchronization means for synchronizing the phase for signals equalized by the first digital equalization means, frequency information threshold means for judging the frequency of the phase synchronization means in a plurality of statuses using one or more threshold values, a second memory for storing tap factors corresponding to the plurality of statuses judged by the frequency information threshold means respectively, and status change factor supplying means for supplying a tap factors, corresponding to the statuses, to the first digital equalization means when the status judged by the frequency information threshold means changes.

BRIEF DESCRIPTION OF THE DRAWINGS

FIG. 3 is a diagram depicting the configuration of an FIR filter having symmetric tap factors according to the embodiment;

FIG. 5 is a first diagram depicting the characteristics of an interpolation filter for controlling the phases of equalization target values according to the embodiment;

FIG. 7 is a diagram depicting an adaptive equalization circuit according to embodiment 2 of the present invention;

BEST MODE FOR CARRYING OUT THE INVENTION

EMBODIMENT 1

Embodiments of the present invention will now be described with reference to FIG. 1 to FIG. 6, and FIG. 8.

Figure 1:
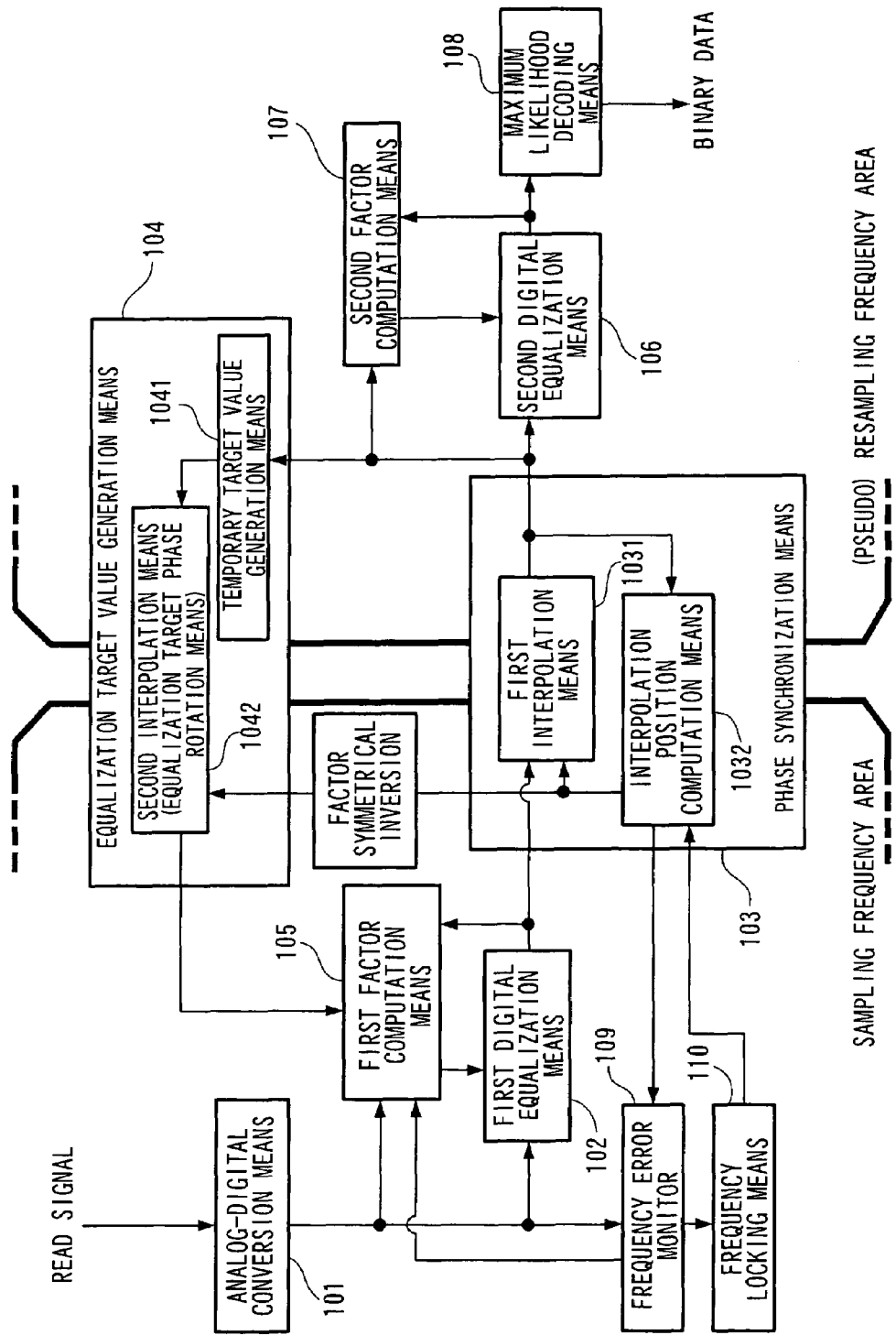
FIG. 1 is a diagram depicting an adaptive equalization circuit according embodiment 1 of the present invention.

The present embodiment in FIG. 1 is a digital read channel using PRML signal processing, which adaptive-equalizes the signals, which are signals read from the recording medium and sampled by the analog-digital conversion means 101 using the first digital equalization means 102 via an amplifier (not illustrated) and a low pass filter for band limiting (not illustrated), and phase-synchronizes the signals by the phase synchronization means 103, then adjusts equalization adaptively by the second digital equalization means 106, decodes the signals by maximum likelihood decoding means 108, and outputs the binary data.

The signals of which band is limited by the low pass filter are sampled and converted into digital data by the analog-digital conversion means 101. The sampling frequency of the analog-digital conversion means 101 will be described. For example, if the velocity of the spindle motor is set to x1 speed and data is written to the disk, and the track where the data is written is reproduced at x1 speed, then the write clock frequency of the data and the read clock frequency (channel frequency) of the data become roughly the same. However in the present invention, phase synchronization is performed after sampling by the analog-digital conversion means 101, so the sampling of the analog-digital conversion means 101 is asynchronized with the read data. Therefore to read the data, the sampling frequency of the analog-digital conversion means 101 must be higher than the read clock frequency of the data.

The signals (analog-digital conversion information) sampled with a frequency that is slightly higher than the read clock frequency of the data by the analog-digital conversion means 101 is equalized by the first digital equalization means 102. For this equalization, a PR (3, 4, 4, 3) method is used for the present embodiment.

The first digital equalization means 102 is an FIR (Finite Impulse Response) filter, which can control the transfer function by the tap factor A, which is output from the first factor computation means 105. In the present embodiment, first digital equalization means 102 equalizes to PR (3, 4, 4, 3). There are some methods for adaptively controlling the tap factors, but here adaptive equalization using an LMS (Least Mean Square) algorithm will be described as an example.

An LMS algorithm is a method for computing factors so that the square error from the equalization target value becomes the minimum, and the formula thereof will be Expression 1.

$$h(n+1)=h(n)+(½)*\mu e(n)u(n) \quad \text{Expression 1}$$

h(n): filter factor vector before adaptation
h(n+1): filter factor vector after adaptation
μ: step size parameter
e(n): error signal at the nth repeat
u(n): tap input vector at the nth repeat
e(n): $d(n)-u^T(n)h(n)$
e(n): error signal
d(n): desired response
$u^T(n)$: transposition of tap input vector If an LMS algorithm is implemented, the factor vector h(n) approaches the optimum value h0 so that the error signal e(n) becomes the minimum, that is the equalization error becomes the minimum. To use this algorithm, the input/output signals of the equalizer and the equalization target value (desired response) are required.

Figure 2:
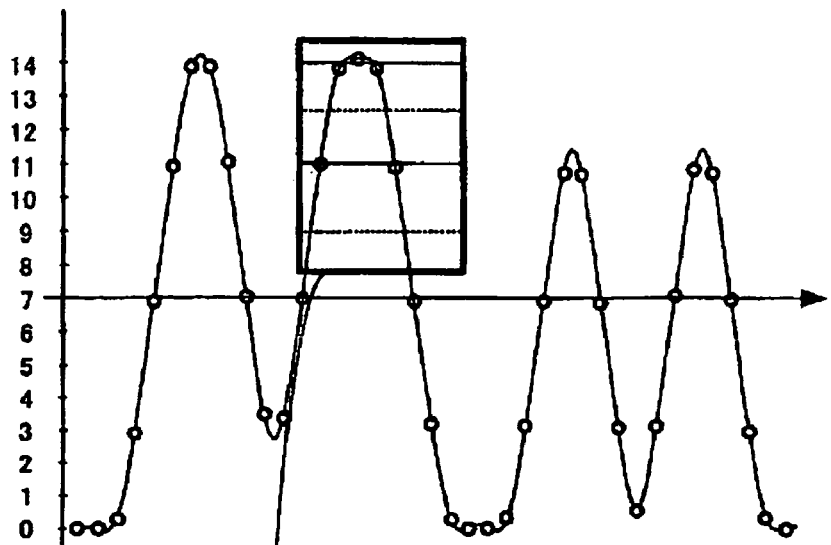
FIG. 2 is a diagram depicting the detection of the equalization target according to the embodiment.
Figure 2:
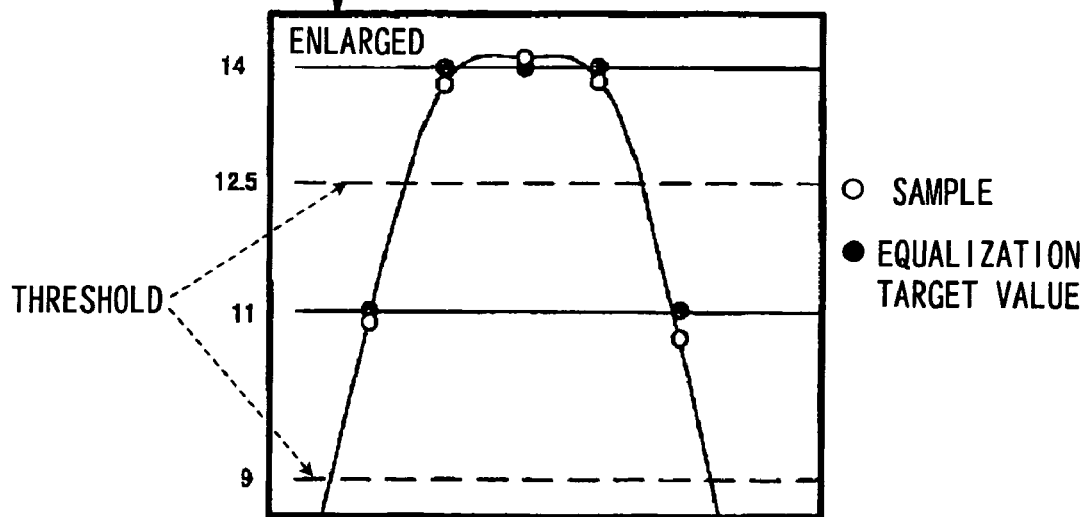

The input/output signals of the equalizer, that are analog-digital conversion information and the output of the first digital equalization means 102, already exist. The problem is the equalization target value. To determine the equalization target value, the following method, for example, is used. It is known that the signals equalized to PR (3, 4, 4, 3) at correct sampling points take five values, 0, 3, 7, 11 and 14, so if sampling at correct sampling points can be performed, then determining the equalization target value is not very difficult. By setting four threshold values, 1.5, 5, 9 and 12.5 for example, the equalization target value is temporarily judged, such as, it is 0 if the signal is smaller than 1.5, and it is 3 if the signal is between 1.5 and 5, and the result is estimated as the equalization target value (FIG. 2). However this is an example when sampling at correct sampling points has been performed, that is the phases are synchronized, and sampling with a channel frequency has been performed. In the present embodiment, the first digital equalization means 102 is inserted between the analog-digital conversion means 101 and the phase synchronization means 103, and signals are sampled with a frequency slightly higher than the channel frequency until phases are synchronized by the phase synchronization means. In other words, even if signals equalized by the first digital equalization means 102 are accurately equalized to PR (3, 4, 4, 3), these signals have not been sampled at correct sampling points, so there are not five values, 0, 3, 7, 11 and 14. Therefore the equalization target value cannot be directly estimated using the above mentioned threshold values.

Figure 8:
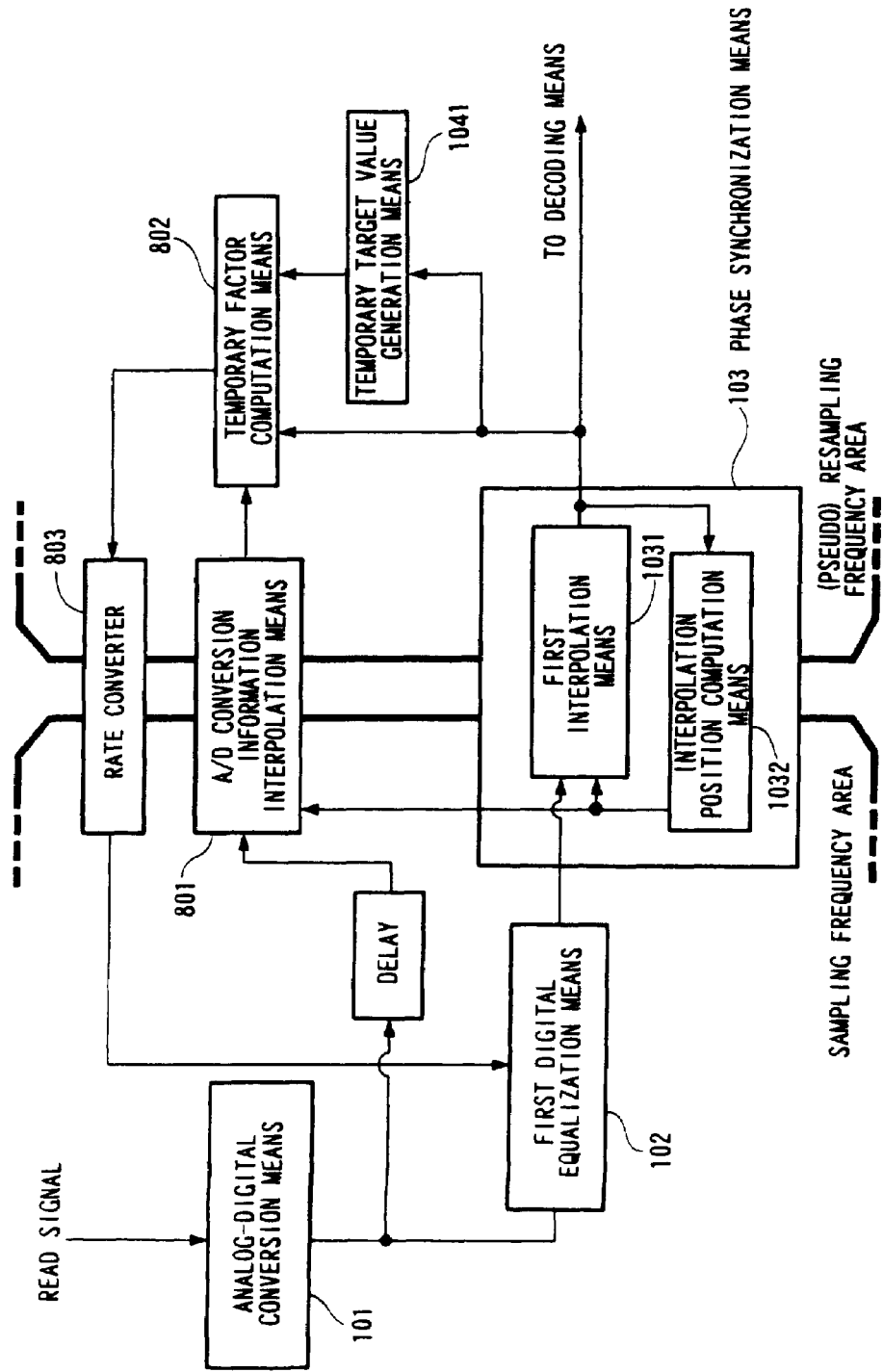
FIG. 8 is a diagram depicting a prior art.

Therefore a possible method is a method in JP2001-184795 A, shown in prior art. To compare with the present embodiment in FIG. 1, prior art is shown in FIG. 8. The same composing elements as FIG. 1 are denoted with the same reference numerals, of which description is omitted. In the example in FIG. 8, phase synchronization is applied not only to the output signals of the first digital equalization means 102, but also to the input signals of the first digital equalization means 102 using the A/D conversion information interpolation means 801, and signals are resampled at correct sample points. Since signals are resampled at correct sample points (phase synchronization), it is easy to estimate an equalization target value using temporary judgment based on the above mentioned threshold values. By this method, the equalizer input/output signals and equalization target values, sampled at correct sampling points, can be determined, and using these signals, the tap factors to be used for the first digital equalization means 102 are determined by the temporary factor computation means 802. However the first digital equalization means 102 is a circuit which operates with a frequency before performing phase synchronization. Therefore it is necessary to convert the tap factor (temporary tap factor) with the resampling frequency determined from the phase-synchronized signals into the tap factor (true tap factor) with a sampling frequency before phase synchronization. For this, the rate converter 803 is necessary, but this rate converter 803 cannot maintain performance as the difference of the sampling frequency and the resampling frequency increases, since burden on the rate converter 803 increases. This difference of these frequencies changes when the track position of the disk medium changes, or when the velocity of the spindle motor changes, for example. Also in this method, the tap factors are computed after phase synchronization is performed, and the computation accuracy has not been improved. As described above, in the case of a system using a digital PLL, the sampling frequency is normally higher than the resampling frequency. In other words, computation is performed in an area where frequency is slow. It is well known that computation accuracy can be improved if computation is performed with a high frequency.

Unlike the above prior art, according to the present invention in FIG. 1, the first factor computation means 105 can compute the tap factor A of the first digital equalization means 102 with the sampling frequency of the analog-digital conversion means before performing phase synchronization. In other words, the rate converter 803, which is a shortcoming of the above method, is unnecessary, and the computation accuracy of signal processing also improves. Also according to the present invention, the scale is smaller than the above prior art, and performance also improves.

In the present invention, the equalization target value with a sampling frequency before performing phase synchronization is determined by the equalization target value generation means 104 from the signals of which phases were synchronized by the phase synchronization means 103. For example, in the temporary target value generation means 1041, the temporary target value, which is the equalization target value with the resampling frequency, is determined using the above mentioned threshold values in the temporary judgment, then the true target value, which is the equalization target value with the sampling frequency before performing phase synchronization, is determined using the second interpolation means (equalization target phase rotation means) 1042. And the tap factor A is computed by the first factor computation means 105 from the input/output signals of the first digital equalization means 102 and the true target value. With this method, the rate converter 803 of the tap factor is unnecessary, and the computation accuracy is improved because signal processing is performed with a high sampling frequency.

Figure 4:
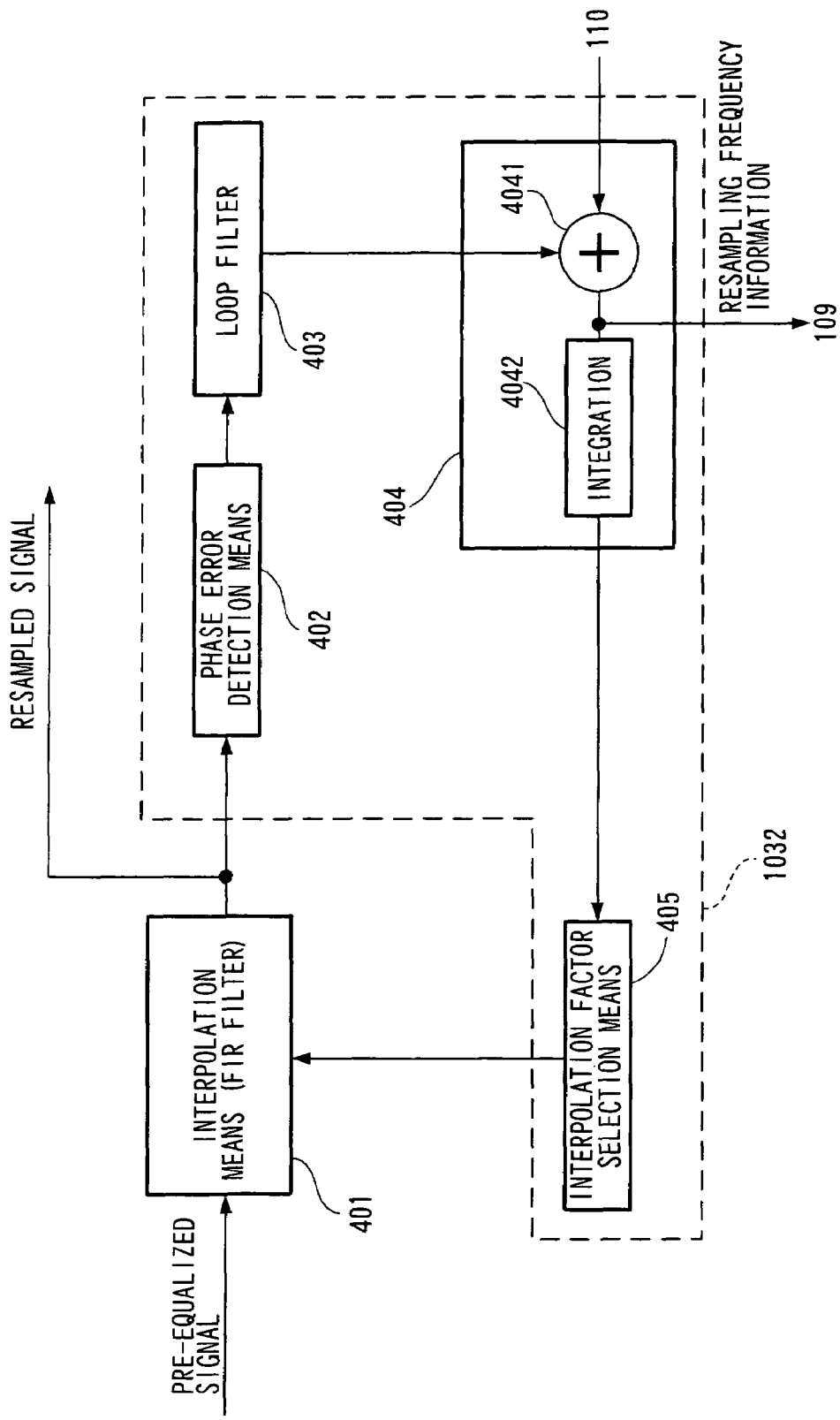
FIG. 4 is a diagram depicting the configuration of phase synchronization means according to the embodiment.

In order to describe the method for determining a true target value, that is an equalization target value with the sampling frequency before performing the above mentioned phase synchronization, the phase synchronization method of the phase synchronization means 103 will be described first. FIG. 4 shows an example of the configuration of the phase synchronization means 103.

The signal equalized by the first digital equalization means 102 slides to the phase at the correct sampling point by the interpolation means 401 (first interpolation means 1031 in FIG. 1). The tap factors of the interpolation means 401 for the interpolation position information, which are required for the interpolation means 401 to perform interpolation, are computed by the interpolation position computation means 1032.

In the present invention, the signals at a correct sampling point after this interpolation, or the signals in the process of obtaining a correct sampling point (signal during locking process), are "resampled" signals, which are output signals of the phase synchronization means 103. Actually this is implemented by installing a holding means, for example, without resampling. Therefore "resampling" is referred to here for convenience, and includes the "pseudo resampling" executed by the hold means.

The interpolated signals (resampled signal) are input to the phase error detection means 402, and the phase error detection means 402 detects the phase error. The detected phase error is input to the loop filter 403, and the loop filter 403 outputs the frequency information. The obtained frequency information is input to the frequency-phase conversion means 404, and the frequency-phase conversion means 404 outputs the phase information to be acquired next. By this phase information, the interpolation factor selection means 405 selects the tap factor h1. The interpolation means 401 slides the phase of the signal using this tap factor h1. In this way, the phase synchronization loop is constructed.

The interpolation means 401 is comprised of an FIR filter. As described above, this filter is for sliding the phase. For this filter, a Nyquist filter, for example, may be used. The characteristic thereof allows sliding only the phases since the frequency characteristic of gain is roughly flat. If the phase has $\pi/x$ resolution (phase here refers to the phase normalized by the Nyquist frequency, where $\pi$ is for one sample), and the interpolation factor selection means 405 determines the factor to be used from x sets of tap factors according to the phase information, then the phase of the signals slide with the phase characteristic of the selected factor.

A method of the phase error detection means 402 is detecting a zero cross point and detecting the phase error, for example. The zero cross point can be detected by setting the threshold values. For example, the case when the signal is higher than the threshold A (status a), the case when the signal is lower than the threshold B (status b), and the case when the signal is between the threshold A and the threshold B (status c), are detected respectively, and if the signal changes from (status a) or (status b) to (status c), the sampling point after the change is the zero cross point. Moreover if the signal changes from (status c) to (status a) or (status b), the sampling point before the change is the zero cross point. By judging the amplitude of this signal and the status transition of these zero cross points, information on the size and direction of the phase error can be obtained.

The loop filter 403 is inserted to be the secondary loop which does not leave a steady-state phase error. For example, in the case of a complete integration type secondary loop, the phase error is integrated, then multiplied by a constant, and this result and the phase error are added.

In the frequency-phase conversion means 404, frequency-phase conversion is performed. It is well known that integration 4042 is used for frequency-phase conversion. If integration is used when a steady-state frequency error exists, however, the numeric value of the phase information is added, and the result becomes enormous. In the present embodiment, a steady-state frequency error exists in the sampling frequency of the analog-digital conversion means 101 and in the resampling frequency, which are the frequencies of the input and output of the interpolation means 1031. In order to prevent a value from becoming enormous, the phase information can be rotated when the phase shifted for $\pi$ (phase for one sample). In other words, if a status where no phase shift exists to a status where the phase shifted for one sample are expressed by 0-1024 (decimal: hereafter dec), then the status is returned to 0 (dec) when the numeric value becomes 1024 (dec). For example, the status is set to 6 (dec) when the numeric value becomes 1030 (dec). The adder 4041 of the frequency-phase conversion means 404 is installed for adjusting the frequency information which the loop filter 403 outputs, and the later mentioned frequency locking means 110 is connected to the other input end of the adder 4041. If the frequency locking means 110 is not used, the adder 4041 is unnecessary.

The interpolation factor selection means 405 selects a factor to slide the phase according to the above mentioned phase information.

In this way, the phase synchronization means 103 performs phase synchronization.

Based on the above phase synchronization method, the second interpolation means 1042 will be described.

The second interpolation means 1042 is comprised of an FIR filter. If the number of taps is the same as the first interpolation means 1031, the first interpolation means 1031 and the second interpolation means 1042 can be constructed in the same configuration. The first interpolation means 1031 converts the signal with a sampling frequency equalized by the first digital equalization means 102 into signals with a resampling frequency. The second interpolation means 1042 performs reverse processing thereof. In other words, the temporary target value, which is the equalization target value with the resampling frequency, determined by the temporary target generation means 1041, is converted into the true target value, which is the equalization target value with the sampling frequency before phase synchronization is performed. A method for this is symmetrically inverting the tap factors used for the first interpolation means 1031, and these inverted tap factors are used for the second interpolation means 1042. If n is the number of taps and the individual tap factor is COE (tap number), then the tap factors to be input to the first interpolation means 1031 are given by h1={COE(1) COE(2) COE(3) - - - COE(n)}, and the tap factors to be input to the second interpolation means 1042 are given by h2={COE(n) COE(n−1) COE(n−2) - - - COE(1)}, which is what h1 is symmetrically inverted. FIG. 5 shows an example of the factors, and FIG. 6 shows the filter characteristics when the factors in FIG. 5 are used.

Figure 6:
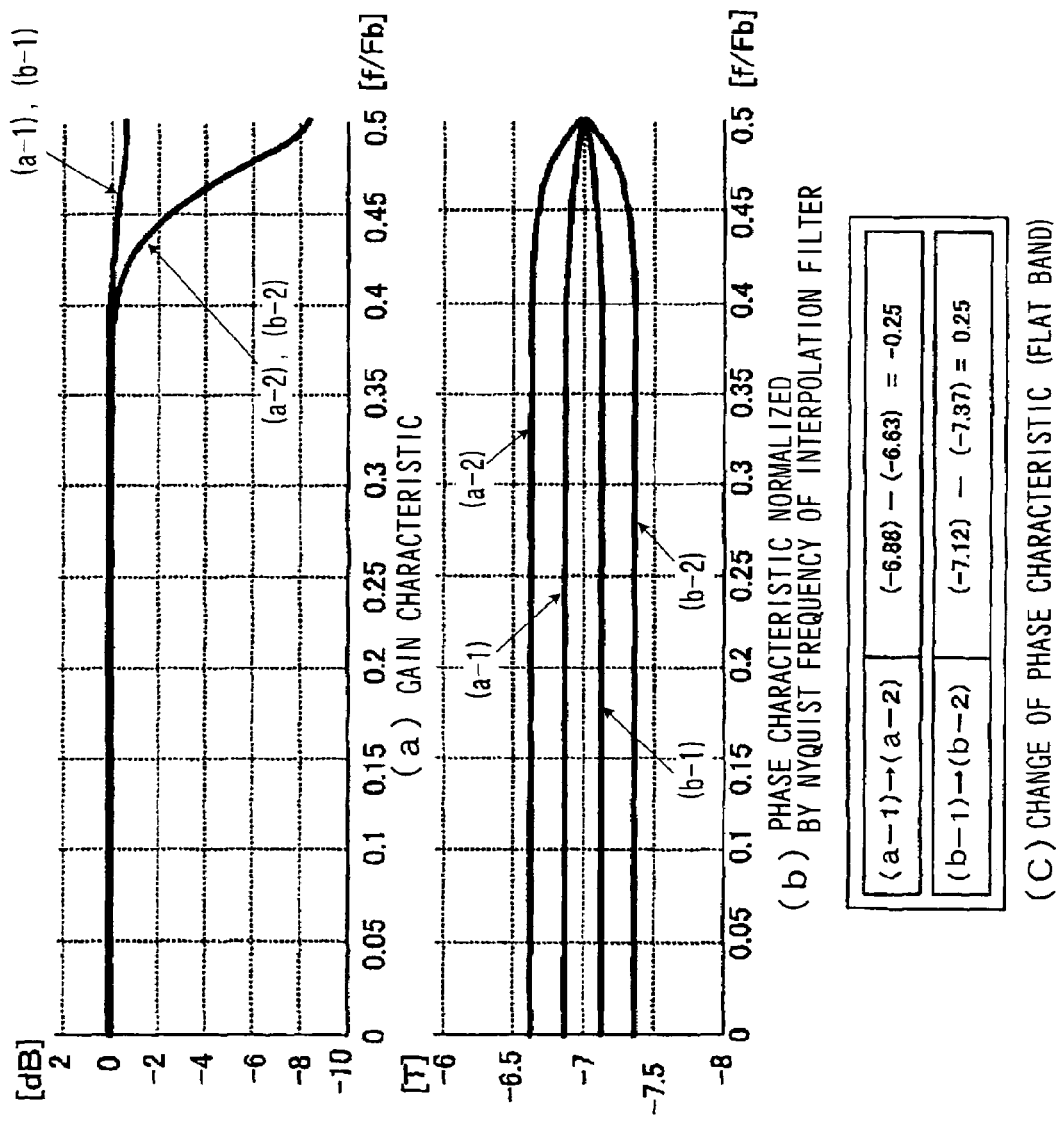
FIG. 6 is a second diagram depicting the characteristics of an interpolation filter for controlling the phases of equalization target values according to the embodiment.

When the tap factor of the first interpolation means 1031 changes from tap factor (a-1) to tap factor (a-2) in FIG. 5 and FIG. 6, the tap factor of the second interpolation means 1042 changes from tap factor (b-1) to tap factor (b-2). The change of the phase characteristic of the first interpolation means 1031 and the change of the phase characteristic of the second interpolation means 1042 at this time are the same size in reverse directions. The change of the phase characteristic indicates frequency, so if the first interpolation means 1031 resamples the signals with the sampling frequency of the analog-digital conversion means 101 to be the signals with the resampling frequency, the second interpolation means 1042 can perform control which is the reverse of the above. This method can be implemented easily without any new installation of special means.

If the number of taps of the second interpolation means 1042 is different from that of the first interpolation means 1031, and if the number of taps of the second interpolation means 1042 is set to smaller than the number of taps of the first interpolation means 1031 to decrease the scale, the relationship of the number of taps n of the first interpolation means 1031 and the number of taps of the second interpolation means 1042 is m<n. In this case, h3={COE(1) COE(2) COE(3) - - - COE(m)}, which is obtained by a later mentioned method and has the similar characteristic as h1, is provided, and h4={COE(m) COE(m−1) COE(m−2) - - - COE(1)}, which are factors when h3 is symmetrically inverted, is supplied to the second interpolation computation means 1042.

Possible methods in this case are applying a square window to h1 to decrease the number of taps to set h3, applying a square window to h1 to decrease the number of taps and also applying another windowing function to remove the non-linear components with finite lengths to set h3, or providing factors predetermined by those methods as a factor table for the second interpolation means 1042. For the tap factors of the interpolation filter, normally a windowing function (e.g. hamming window, hanning window) is applied to the sampling function, and non-linear components with finite lengths are removed.

By using such symmetric factors, the second interpolation means 1042 can easily perform signal frequency control reversed from the first interpolation means 1031.

By the above method, a true target value can be determined using the second interpolation means 1042. In the first factor computation means 105, tap factors can be computed with the sampling frequency of the analog-digital conversion means 101 using this true target value and the input/output signals of the first digital equalization means 102, and by this, computation accuracy improves more than the prior art. In digital signal processing, it is a great advantage that the factors can be computed with high frequency.

In the present embodiment, the first digital equalization means 102 and the first interpolation means 1031 are separate FIR filters, but both filters may be integrated into one FIR filter by convolution of the factors.

The first digital equalization means 102 is comprised of an FIR filter in the above description, but a new advantage is generated if this filter is constructed to be a tap factor symmetric type. FIG. 3 shows a configuration example of the tap factor symmetric type FIR filter. One advantage in making the tap factors A to be symmetric is that the scale becomes small. If the number of taps n is an odd number, for example, the number of multipliers of the filter can be decreased to be (n+1)/2, and the same number of multipliers can be decreased in the first factor computation means 105, so the scale can be decreased considerably.

Another advantage of symmetric type tap factors is that contention of phase control can be prevented. In the configuration of the present invention, the adaptive equalization loop and the phase synchronization loop form a double loop, and if the phase is controlled by the first digital equalization means 102, contention with the phase synchronization loop may occur. By setting the tap factors A to be symmetric, the first digital equalization means 102 need not control phase. However, it is possible that the first digital equalization means need not control phase even if a symmetric type is not used, because if the band of the control is set so as to be considerably different from the band of the phase synchronization means 103, contention can be prevented even if the first digital equalization means performs phase control.

Now the frequency error monitor 109 and the frequency locking means 110 will be described.

By setting the tap factors A of the first digital equalization means 102 to be symmetric, it is possible to not perform phase control, as described above. If this is applied, adaptive equalization can be operated even in a status where the phase is not locked. A problem of operating the adaptive equalization in the status where the phase is not locked is that the equalization target values cannot be estimated very well, and adaptive equalization control diverges when the equalization means is executing phase control. However if it is set such that the equalization means does not control phase, phase is not locked, and control does not diverge very much, even if the equalization target values are not estimated very well. But if the frequency is shifted too much, control may diverge. To prevent this, the frequency error monitor 109 is installed. By this installation, adaptive control can be started when the frequency error becomes smaller than a predetermined arbitrary value. An advantage of this is that when the locking of the phase synchronization means is difficult because equalization shifted for any reason, this problem can be solved by performing adaptive equalization in advance. In other words, errors due to PLL locking, when the characteristic of the signal is abnormal, dramatically decrease. Even if the characteristic of the signals is normal, the jitter amount can be controlled by decreasing the equalization error in advance, and the signals can be filtered to be signals that are advantageous for PLL.

Figure 9:
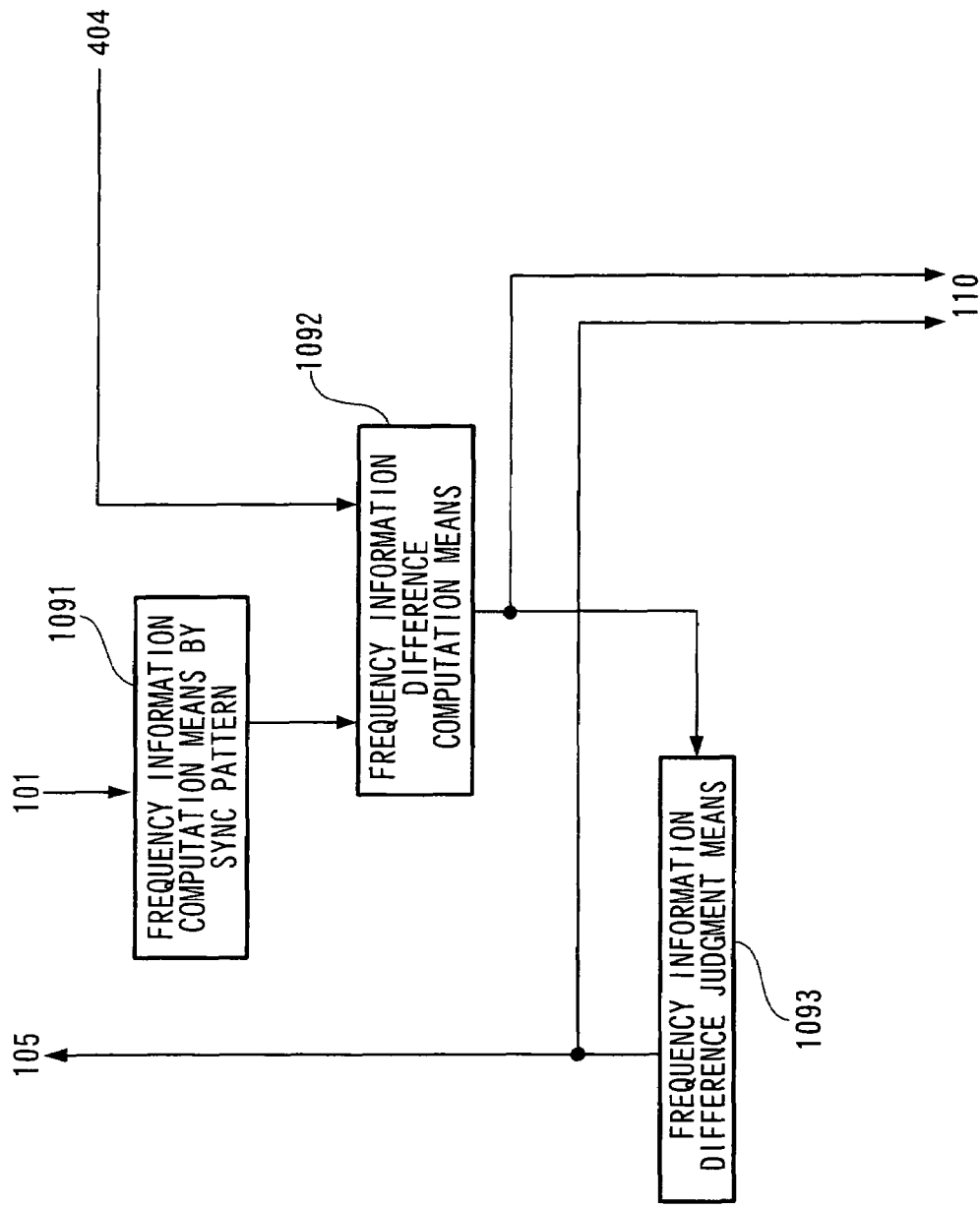
FIG. 9 is a diagram depicting the configuration of the frequency error monitor 109.

FIG. 9 shows an example of the frequency error monitor 109. First frequency information will be described. From the resampling frequency information which is output by the frequency-phase conversion means 404, it can be known how many times of the sampling frequency of the analog-digital conversion means 101 the resampling rate of the phase synchronization means 103 is. For example, if the sampling frequency of the analog-digital conversion means 101 is 110 MHz and the resampling frequency information when the phase synchronization means 103 is resampling at 100 MHz is 256 (dec), then the sampling frequency of the analog-digital conversion means 101 is 120 MHz, and the resampling frequency information when the phase synchronization means 103 is resampling at 100 MHz is indicated by a value of 512 (dec), that is the rate and the frequency information are corresponded to each other. The rate at this time is assumed to be rate A.

Now an example of determining the frequency information corresponding to the rate for actual resampling will be described. In the frequency information computation means 1091 by sync patterns, the frequency information is computed as follows. When a sync pattern exists in the data recorded on the disk medium at every predetermined data count, the number of samples between two sync patterns is counted from the output of the analog-digital conversion means 101, and the frequency information, based on the sync pattern, is generated from this number of samples. For example, if there is a sync pattern at every 1000 data recorded, and the counted number of samples between the sync patterns is 1100, then the sampling frequency of the analog-digital conversion means is 1.1 times of the frequency of the data. The frequency information computation means 1091 can determine the rate of a roughly accurate sampling frequency and the frequency to be resampled based on the sync patterns, and output the frequency information according to this rate. The rate at this time is assumed to be rate B.

The frequency error monitor 109 compares the frequency information corresponding to the rate of resampling currently executed by the phase synchronization means 103 (rate A) and the frequency information corresponding to the rate of actual resampling (rate B), and if the difference thereof is greater then a predetermined judgment value, a control signal for not computing the tap factors is sent to the first factor computation means 105, or if the difference thereof is smaller than a predetermined judgment value, a control signal for computing the tap factors is sent to the first factor computation means 105.

Then in the frequency information difference computation means 1092, the difference (frequency error) for comparing the frequency information is computed as mentioned above. In other words, the difference between the frequency information that the frequency-phase conversion means 404 outputs and the frequency information that the frequency information computation means 1091 outputs based on a sync pattern is computed. This frequency error is judged whether it is greater or smaller than the judgment value that is set by the register, which is not illustrated, in the frequency information difference judgment means 1093, and the comparison result is output to the first factor computation means 105 and the frequency locking means 110. If the control signal which is output by the frequency information difference judgment means 1093 indicates that the frequency error is greater than the judgment value, the first factor computation means 105 does not compute the tap factors, and if it indicates that it is smaller than the judgment value, the first factor computation means 105 computes the tap factors.

Now the frequency locking means 110 will be described. As mentioned above, adaptive control can be started if the frequency error is small. This frequency error is controlled to be small by the phase synchronization control of the phase synchronization means 103. However, the frequency locking range of the phase synchronization loop has a limitation, and it is possible that in some cases the frequency error does not become small regardless what is implemented. So a further performance improvement is provided by newly installing a means of control to decrease this frequency error. It is the frequency locking means 110 that performs this control. If the result of the frequency information difference judgment means 1093 indicates that the frequency error that is output by the frequency information difference computation means 1092 is greater than the judgment value, for example, then the frequency locking means 110 inputs the frequency error to the adder 4041 of the frequency-phase conversion means 404, so that the resampling frequency of the phase synchronization means 103 corresponds to the frequency of actual resampling. If the result indicates that the frequency error is smaller than the judgment value, then 0 is input to the adder 4041 of the frequency-phase conversion means 404, so as not to perform frequency locking using the frequency locking means 110. In the above description, the information of the resampling frequency is controlled by frequency locking, but frequency locking is not limited to this embodiment, but is also possible by controlling the sampling frequency of the analog-digital conversion means 101, rather than by controlling the information of the resampling frequency.

By improving phase synchronization (including frequency locking) and the performance of adaptive equalization respectively, the performance of phase synchronization improves, which improves the performance of adaptive equalization, and if the performance of adaptive equalization improves, the performance of phase synchronization improves, and as a result, a fine performance improvement loop is created where a considerable performance improvement can be implemented.

Now the second adaptive equalization will be described. In post-adaptive equalization, the second factor computation section 107 computes the tap factor B from the input/output signals of the second digital equalization means 106 using the LMS algorithm of expression 1, for example, and the transfer characteristic of the second digital equalization means 106 is adaptively controlled. In the present embodiment, the second digital equalization means 106 is an FIR filter which can have symmetric type tap factors B, and the second factor computation section 107 has a configuration where an asymmetric factor computation corresponding to the above is possible. The advantage of setting factors as asymmetric is that if the reproducing signals have passed through a transmission path which has the characteristic where the group delay is not flat, correction is possible. Applying this asymmetric information to the first digital equalization means 102 is also an effective method.

As mentioned above, the input/output signals of the equalization means and the equalization target values are necessary for performing adaptive equalization. Possible methods for acquiring the equalization target values of the second digital equalization means 106 are using temporary target values determined by the temporary target value generation means 1041, or newly installing the second temporary target value generation means (not illustrated) for estimating the equalization target values from the output signals of the second digital equalization means 106. The determined equalization target values and the input/output signals of the second digital equalization means 106 are input to the second factor computation section 107, and the factors are computed.

The signals of which equalization is further adjusted by post-adaptive equalization are input to the maximum likelihood decoding means 108, and the possible current status and respective probability are calculated using the correlation of signal series PR (3, 4, 4, 3). Using this probability computation, most likely data can be decoded.

For the data binarized by the maximum likelihood decoding means 108, recorded codes are decoded and error correction is made, then the data is transferred to the host.

The present invention was described using a disk device, but the present invention is not limited to the present embodiment, but can be applied to such optical disks as DVD-RAM, CD and DVD-ROM, such magnetic disks as HDD, such magnetic tapes as DDS (Digital Data Storage), and for other signals for which equalization is necessary.

EMBODIMENT 2

Figure 10:
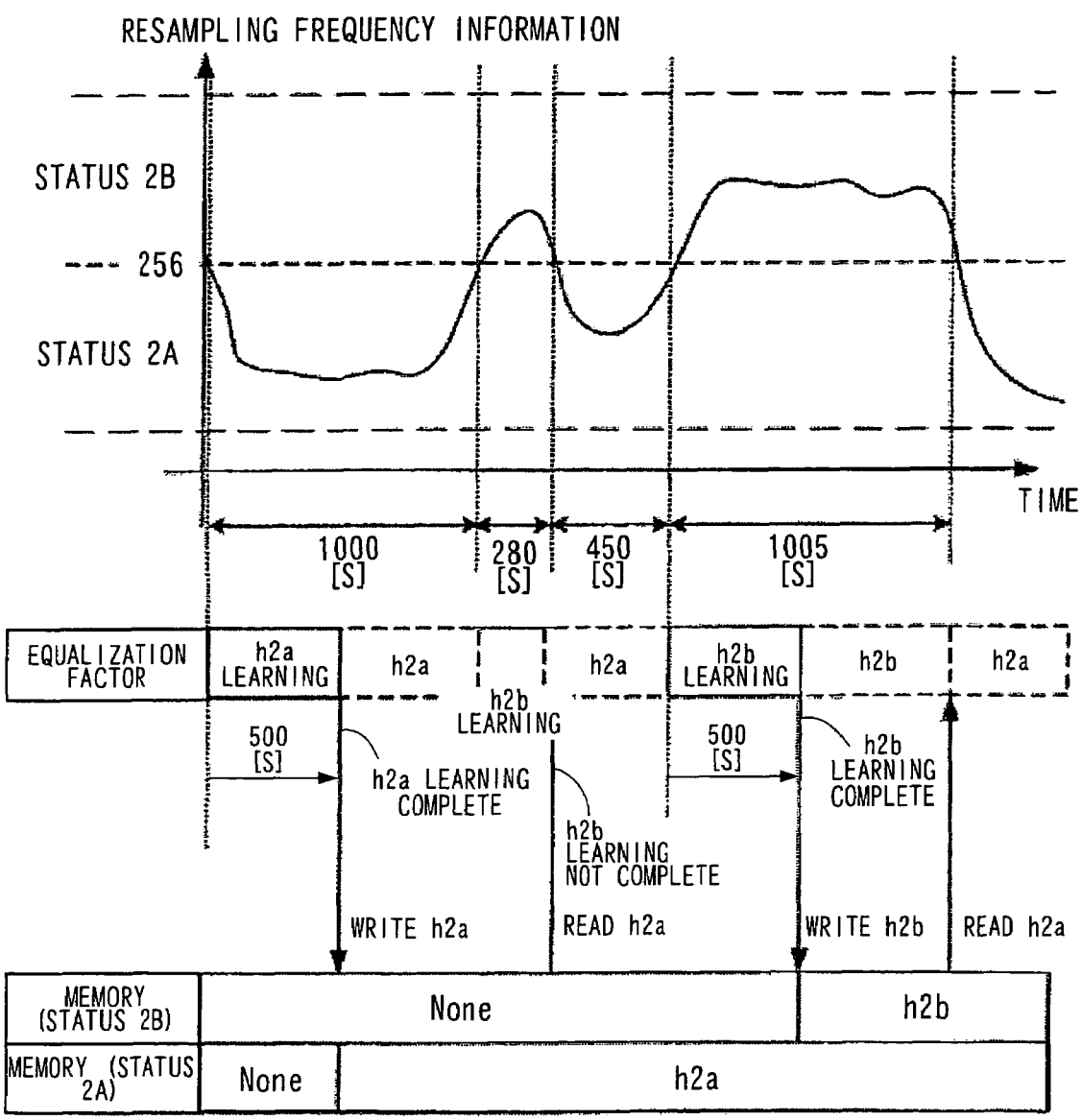
FIG. 10 is a diagram illustrating the operation of the embodiment 2 of the present invention.

The present embodiment will now be described with reference to FIG. 7 and FIG. 10. FIG. 7 shows a diagram depicting the configuration of the present embodiment. The same composing elements as the above mentioned embodiment are denoted with the same reference numerals, of which description is omitted. The difference from embodiment 1 is that the embodiment 2 comprises frequency information threshold means 701, memory 702, status time measurement means 703, status change processing means 704, factor memory storage processing means 705, factor computation control means 706 and equalization factor selection means 707.

The present embodiment is a read channel using PRML signal processing, which equalizes signals, after the analog-digital conversion means 101 samples the signals read from the disk medium via an amplifier (not illustrated) and a low pass filter for band limitation (not illustrated), using the first digital equalization means 102, phase-synchronizes the signals by the phase synchronization means 103, then decodes the signals by the maximum likelihood decoding means (not illustrated), and outputs the binary data.

When the rotation velocity of the spindle motor becomes irregular, or when the track position changes when data is read by the CAV method, the rates of sampling frequency of the analog-digital conversion means 101 and the resampling frequency of the phase synchronization means 103 change. The adaptive equalization circuit in the present embodiment is characterized in that it performs the learning of tap factors according to this change, and stops learning of the factors if the rates are stable for a predetermined period.

In the present embodiment, the status when the ratio of the rates of the sampling frequency of the analog-digital conversion means 101 and the resampling frequency of the phase synchronization means 103 is 1.1:1.0-1.2:1.0 is regarded as status 2A, and the status when the ratio is 1.2:1.0-1.3:1.0 is regarded as status 2B, for example, and it is assumed that the rate changes between these two statuses.

As described in embodiment 1, the resampling frequency information shown in FIG. 4 corresponds to the rate of the phase synchronization means 103. In the present embodiment, it is assumed that the resampling frequency information is 256 (dec) at 1.1:1.0, 512 (dec) at 1.2:1.0, and 768 (dec) at 1.3:1.0, for example. In other words, the rate changes in this range, so the resampling frequency information changes in a 256-768 (dec) range.

The frequency information threshold means 701 is a means of sorting the resampling frequency information, which is output by the phase synchronization means 103, into a plurality of statuses using threshold values. Here the status is divided into status 2A and status 2B, as mentioned above, so the threshold is set to 512 (dec). In other words, if the resampling frequency information is greater than 512, the rate is between 1.1:1.0-1.2:1.0, and if smaller, the rate is between 1.2:1.0-1.3:1.0. The judgment result is output to the status time measurement means 703, status change processing means 704 and factor memory storage processing means 705. The status time measurement means 703 has a counter which is reset when the status that the frequency information threshold means 701 outputs changes, and counts the period that exists in a same status. For example, if the current status is status 2A, the time from when the status changed from 2B to 2A in the past up to the present has been counted. This time is acquired by counting the number of samples of the analog-digital conversion means 101. The counted number of samples is compared with the register set value, which is not shown in FIG. 4, and if it is greater than the set value, this is regarded that sufficient learning has been made, and this judgment is transferred to the factor memory storage processing means 705.

When it is judged that sufficient learning has been made by the output of the status time measurement means 703, the factor memory storage processing means 705 instructs the factor computation control means 706 to stop computation of the first factor computation means 105. At the same time, the factor memory storage processing means 705 writes the tap factor at the point when the first factor computation means 105 stopped computation to the area for the status 2A in the memory 702 as a factor corresponding to the status 2A.

The factor computation control means 706 controls learning stop and start processing of the first factor computation means 105 based on the control signals from the factor memory storage processing means 705 and status change processing means 704.

The status change processing means 704 observes the change of status which the frequency information threshold means 701 outputs, and if the status changed from the status 2A to the status 2B, for example, the status change processing means 704 refers to the tap factor of the area for status 2B in the memory 702. If a tap factor corresponding to status 2B has not been stored in the memory 702, the status change processing means 704 notifies the factor computation control means 706 to start the factor computation in the first factor computation means 105, and notifies the equalization factor selection means 707 to supply the output of the first factor computation means 105 to the first digital equalization means 102. If a tap factor corresponding to the status 2B has been stored in the memory 702, on the other hand, the status change processing means 704 notifies the factor computation control means 706 to stop the factor computation in the first factor computation means 105, and notifies the equalization factor selection means 707 to supply the tap factor corresponding to the status 2B, which is stored in the memory 702, to the first digital equalization means 102. In other words, when a status is changed, if the factor corresponding to the status after change has already been learned, equalization is performed by the first digital equalization means 102 using the tap factor of the learning result, and if the factor after the change has not yet been learned, equalization is performed by the first digital equalization means 102 using the tap factor which is currently being learned by the first factor computation means 105.

Therefore when the tap factor corresponding to the current status has already been learned and stored in the memory, learning by the first factor computation device can be stopped, by which power consumption can be decreased. In the present embodiment, the equalization target value generation means 104 may be stopped together when the first factor computation means 105 is stopped.

Now the status change and the factor learning operation will be further described with reference to FIG. 10.

This is an example of the case when a factor is not stored in the memory 702, where the circuit operation is started to change the status 2B to status 2A, and the status is changed to the status 2B at 1000 samples later, then changed to the status 2A at 280 samples later, then changed to the status 2B at 450 samples later, and changed to the status 2A at 1005 samples later. The set value to compare with the number of samples counted by the status time measurement means 703 is assumed to be 500 samples.

At first, when the status 2B is changed to the status 2A, the status change processing means 704 refers to the status 2A area of the memory 702. At this time, a factor corresponding to the status 2A has not been stored in the memory 702. Therefore the status change processing means 704 notifies the factor computation control means 706 to start computation by the first factor computation means 105, and the factor computation control means 706 has the first factor computation means 105 start computation. Also at this time, the status change processing means 704 notifies the equalization factor selection means 707 to supply the tap factor being learned by the first factor computation means 105 to the first digital equalization means 102, and the equalization factor selection means 707 selects the tap factor which the first factor computation means 105 outputs, and outputs it to the first digital equalization means 102.

The status time measurement means 703 observes the status, which is the output of the frequency information threshold means 701, and measures the number of samples to see if the status 2A continues. In the case of the example in FIG. 10, the status 2A continues for a period longer than 500 samples, which is the register set value of the status time measurement means 703. When the counted number of samples exceeds 500 samples, the status time measurement means 703 notifies the factor memory storage processing means 705 that the register set value was exceeded. And the factor memory storage processing means 705 notifies the factor computation processing means 706 that the computation of the tap factor by the first factor computation means 105 is stopped. So the computation by the first factor computation means 105 stops, and the output thereof is fixed as the tap factor at stopping. At the same time, the factor memory storage processing means 705 writes the tap factor, which is output by the first factor computation means 105, to the area for the status 2A in the memory 702. In this way, the tap factor of the status 2A is determined and is stored as h2a. Then the first factor computation means 105 stops until the status 2A changes to the status 2B next, and the tap factor to be supplied to the first digital equalization means 102 remains fixed.

When the status 2A changes to the status 2B after this, the status change processing means 704 refers to the area for the status 2B in the memory 702. Since a factor corresponding to the status 2B has not been stored in the memory 702, operation of the first factor computation means 105 is started again, and the tap factor is supplied to the first digital equalization means 102.

Then when 280 samples of time elapses, the status 2B changes to the status 2A. Since the count of the number of samples by the status time measurement means 703 did not exceed the register set value, the above mentioned write operation to the memory 703 is not executed. At the same time, the status change processing means 704 refers to the area for the status 2A in the memory 702. Since the factor corresponding to the status 2A has been stored in the area for status 2A in the memory 702, the status change processing means 704 notifies the factor computation control means 706 that the computation of the tap factor by the first factor computation means is stopped, and has the first factor computation means stop the computation. Also the status change processing means 704 notifies the equalization factor selection means 707 that the value of the memory 703, which was read, is supplied to the first digital equalization means 102, and the tap factor stored in the area for the status 2A in the memory 703, which was read by the status change processing means 704, is supplied to the first digital equalization means 102. In this way, when a status is changed, and if the factor corresponding to the status after change has been stored, that tap factor is supplied to the first digital equalization means 102.

Then after 450 samples elapse, the status 2A changes to status 2B. At this time, a factor corresponding to status 2B has not been stored in the memory 702, the operation of the first factor computation means 105 is started, and the tap factor is supplied to the first digital equalization means 102.

During 1005 samples after this, the status remains as the status 2B. Therefore the status time measurement means 703 judges that sufficient learning has been made at the point when 500 samples were counted, and the factor memory storage processing means 705 stops the first factor computation means 105, and writes the tap factor in the status 2B area in the memory 703. By this, the tap factor for status 2B is also determined and is stored as h2b.

Hereafter when the status changes to the status 2A, h2a in the memory 703 is supplied to the first digital equalization means 102, and when the status changes to the status 2B, h2b in the memory 703 is supplied, and the first factor computation means remains stopped.

As described above, according to the present embodiment, the first factor computation means 105 is operated if the factors corresponding to the respective statuses are not stored in the memory, and if stored, the first factor computation means 105 is stopped, and the first digital equalization means 102 performs equalization using the tap factor stored in the memory 702, so power consumption can be decreased.

In the present embodiment, sufficient learning is judged by a method for counting the number of samples using the status time measurement means 703, but to judge sufficient learning, a threshold may be set for the equalization error determined by the first factor computation means 105, so as to compare the threshold and the equalization error, and when the equalization error is smaller, it may be judged as sufficient learning.

In the present embodiment, an example of setting one threshold value of the frequency information threshold means 701 was shown, but a plurality of thresholds may be set, increasing the number of statuses to be judged to three or more, where the tap factors corresponding to each status are learned and stored in the memory 702. By this, the tap factors can be switched more closely for wider frequency bands, so equalization shifts in the first digital equalization means 102 can be decreased.

The present invention is not limited to the present embodiment, but can be applied to such optical disks as DVD-RAM, CD and DVD-ROM, such magnetic disks as HDD, such magnetic tapes as DDS, and for other signals for which equalization is required.

EMBODIMENT 3

Figure 11:
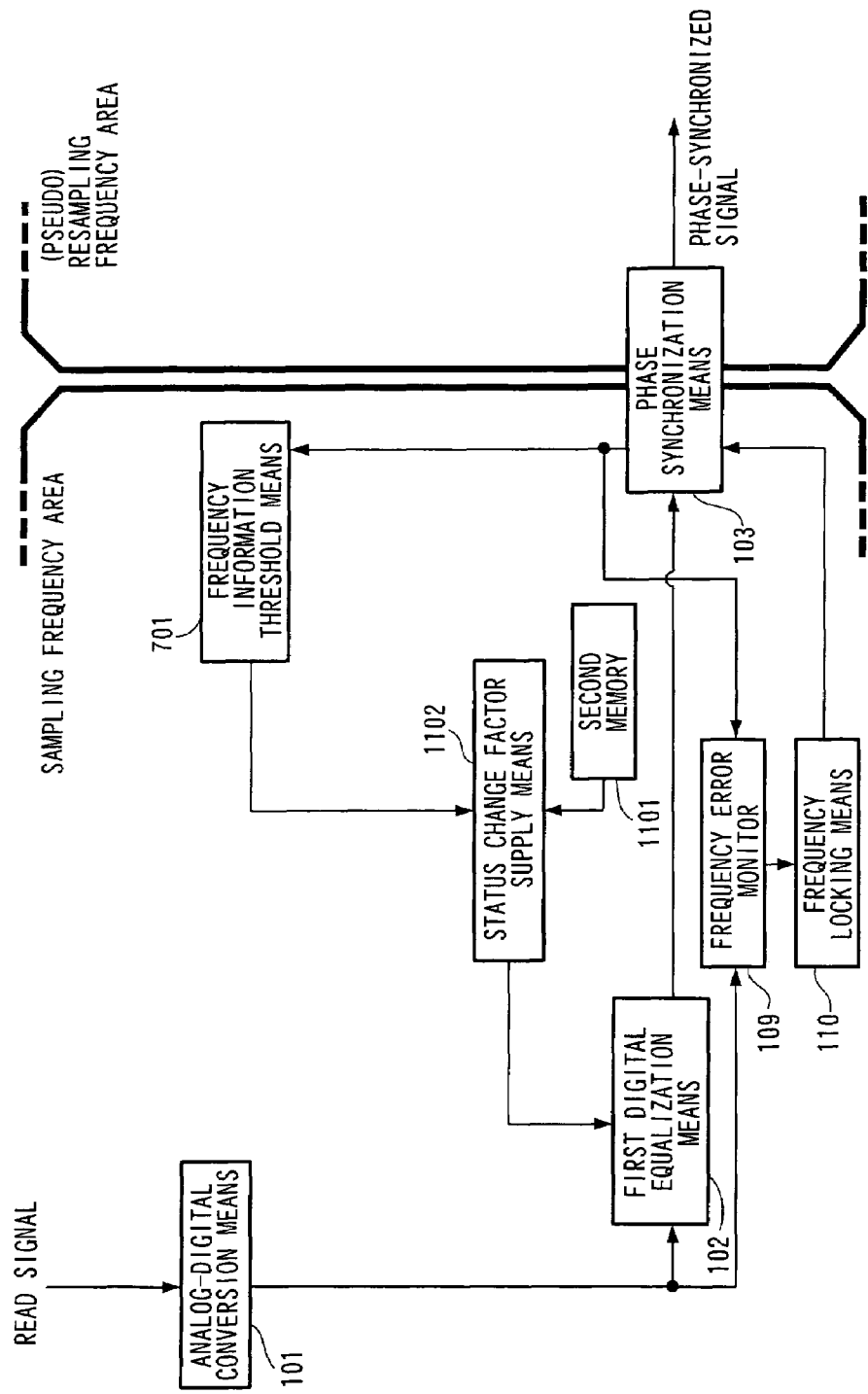
FIG. 11 is a diagram depicting an adaptive equalization circuit according to embodiment 3 of the present invention.

The present embodiment will now be described with reference to FIG. 11. The same composing elements as the above mentioned embodiment are denoted with the same reference numerals, of which description is omitted.

The present invention is a read channel using PRML signal processing, where after the signals read from a disk medium is sampled by the analog-digital conversion means 101 via an amplifier (not illustrated) and a low pass filter for band limiting (not illustrated), the signals are equalized by the first digital equalization means 102, phase-synchronized by the phase synchronization means 103, decoded by the maximum likelihood decoding means (not illustrated), and binary data is output.

As described in embodiment 2, the frequency information threshold means 701 is a means for judging a plurality of rate statuses using thresholds. If the tap factors corresponding to each of these plurality of statuses are stored in the memory 702, it is unnecessary to compute factors by the first factor computation means 105, and a tap factor corresponding to the respective rate can be selected by simply referring to the memory 702.

Extending this, the following configuration is also possible. For example, the above mentioned embodiment 2 is implemented by computer simulation, tap factors corresponding to all of the plurality of statuses to be judged by the frequency information threshold means 701 are determined and stored in the second memory 1101 in advance using reproducing signals for testing. In the case of FIG. 10, for example, h2a, which is a tap factor corresponding to the status 2A, and h2b, which is a tap factor corresponding to the status 2B, are determined and stored in the second memory 1101 in advance.

The status change factor supply means 1102 observes the change of status which is output by the frequency information threshold means 701, and if the status changes, the status change factor supply means 1102 reads the tap factor corresponding to the status after change from the second memory 1101, and inputs the tap factor to the third digital equalization means 1101.

By this, a tap factor corresponding to each resampling frequency information can be selected.

According to the present embodiment, the tap factors to be used for the first digital equalization means 102 are determined by computer simulation in advance, and the tap factors are switched according to the change of the resampling frequency, so a circuit for learning the tap factors is unnecessary, and the circuit scale can be decreased. Since the tap factors are determined in advance, equalization can be performed using optimum tap factors immediately after the resampling frequency changes.

In the present embodiment, the tap factors are determined using embodiment 2, but this is not limited to embodiment 2, but the tap factors may be determined by another method, including embodiment 1.

The present invention is not limited to the present embodiments, but can be applied to such optical disks as DVD-RAM, CD and DVD-ROM, such magnetic dicks as HDD, such a magnetic tapes as DDS, and for other signals for which equalization is required.

I claim:

1. An adaptive equalization circuit, comprising:
   an analog-digital conversion device for sampling signals read from a recording medium;
   a first digital equalization device for equalizing waveforms of first output signals from said analog-digital conversion device;
   a phase synchronization device for synchronizing phases for second output signals from said first digital equalization device;
   an equalization target value generation device for generating an equalization target value of said first digital equalization device from third output signals from said phase synchronization device, and for outputting fourth output signals;
   a second digital equalization device for inputting the third output signals from said phase synchronization device and performing adaptive equalization;
   a first factor computation device for receiving as input signals said first, second, and fourth output signals, and for computing tap factors of said first digital equalization device from said first, second, and fourth output signals; and
   a second factor computation device for computing tap factors of said second digital equalization device from the third output signals from said phase synchronization device and fifth output signals from said second digital equalization device.

2. The adaptive equalization circuit according to claim 1, wherein said second digital equalization device is a FIR filter having tap factors of an asymmetric type.

3. An adaptive equalization circuit, comprising:
   an analog-digital conversion device for sampling signals read from a recording medium;
   a first digital equalization device for equalizing waveforms of first output signals from said analog-digital conversion device;
   a phase synchronization device for synchronizing phases for second output signals from said first digital equalization device;
   an equalization target value generation device for generating an equalization target value of said first digital equalization device from third output signals from said phase synchronization device, and for outputting fourth output signals, said equalization target value generation device comprising:
      a temporary target value generation device for generating a temporary target value, that is the equalization target value of the phase-synchronized signals, and
      an equalization target phase rotation device for generating a true target value, from said temporary target value, the true target value being an equalization target value before synchronizing phases by said phase synchronization device; and
   a first factor computation device for receiving as input signals said first, second, and fourth output signals, and for computing tap factors of said first digital equalization device from said first, second, and fourth output signals
   wherein said phase synchronization device is a phase synchronization loop comprising a first interpolation device for interpolating the second output signals from said first digital equalization device and an interpolation position computation device for computing an interpolation position of said first interpolation device from sixth output signals from said first interpolation device,
   said equalization target phase rotation device is a second interpolation device for interpolating said temporary target value and acquiring said true target value, an interpolation position of said second interpolation device being computed by said interpolation position computation device
   said first interpolation device and second interpolation device are FIR filters, said interpolation position computation device outputs tap factors as information of the interpolation position, and if each tap factor is COE(n) where n is the number of taps, the tap factor h1 to be supplied to said first interpolation device is given by h1 ={COE(1) COE(2) COE(3) - - - COE(n)}, and
   when the number of taps of said second interpolation device is the same as the number of taps of said first interpolation device, the tap factor h2 to be supplied to the second interpolation device has a symmetrical relationship with said h1, that is given by h2 ={COE(n) COE(n-1) COE(n-2) - - - COE(1)}, or the factor h2 is delayed and input to the second interpolation device,
   when the number of taps of said second interpolation device is different from the number of taps of said first interpolation device, h3, that is a factor having a phase characteristic equivalent to said h1, is given by h3 ={COE(1) COE(2) COE(3) - - - COE(m)}, where m is a number of taps, and
   the tap factor h4 to be supplied to said second interpolation device has a symmetrical relationship with said h3 and is given by h4 ={COE(m) COE(m-1) COE(m-2) - - - COE(1)}, or the factor h4 is delayed and input to said second interpolation device.

4. An adaptive equalization circuit, comprising:
- an analog-digital conversion device for sampling signals read from a recording medium;
- a first digital equalization device for equalizing waveforms of first output signals from said analog-digital conversion device, said first digital equalization device being an FIR filter having tap factors of a symmetric type;
- a phase synchronization device for synchronizing phases for second output signals from said first digital equalization device;
- an equalization target value generation device for generating an equalization target value of said first digital equalization device from third output signals from said phase synchronization device, and for outputting fourth output signals;
- a first factor computation device for receiving as input signals said first, second, and fourth output signals, and for computing tap factors of said first digital equalization device from said first, second, and fourth output signals; and
- a frequency error monitor for monitoring frequency errors of the phase synchronization performed by said phase synchronization device, wherein when said frequency error is smaller than a predetermined value, said first factor computation device supplies computed tap factors to the first digital equalization device and starts adaptive equalization.

5. The adaptive equalization circuit according to claim 4, wherein said first factor computation device supplies the computed tap factors to the first digital equalization device and performs adaptive equalization regardless of whether phase synchronization performed by said phase synchronization device is in an unlock status.

6. The adaptive equalization circuit according to claim 4, further comprising a frequency locking device for changing the frequency information to be used for computation by said interpolation position computation device so as to decrease the frequency errors detected by said frequency error monitor.

7. An adaptive equalization circuit, comprising:
- an analog-digital conversion device for sampling signals read from a recording medium;
- a first digital equalization device for equalizing waveforms of first output signals from said analog-digital conversion device;
- a phase synchronization device for synchronizing phases for second output signals from said first digital equalization device;
- an equalization target value generation device for generating an equalization target value of said first digital equalization device from third output signals from said phase synchronization device, and for outputting fourth output signals;
- a first factor computation device for receiving as input signals said first, second, and fourth output signals, and for computing tap factors of said first digital equalization device from said first, second, and fourth output signals;
- a frequency information threshold device for judging frequency information of said phase synchronization device in a plurality of statuses using one or more threshold values;
- a memory for storing tap factors corresponding to the statuses judged by said frequency information threshold device;
- an equalization factor selection device for selecting either an output of said first factor computation device or of said memory when a tap factor is supplied to said first digital equalization device;
- a status time measurement device for measuring the duration of a status of the statuses judged by said frequency information and comparing said duration with a predetermined value;
- a factor computation control device for controlling the starting or stopping of the computation of said first factor computation device;
- a factor memory storage processing device for transferring an instruction to stop the computation by said first factor computation device to said factor computation control device if said duration is longer than said predetermined value in said status time measurement device, and storing the tap factors after said factor computation device stops at a position corresponding to the status judged by said frequency information threshold device of said memory; and
- a status change processing device for switching said equalization factor selection device so as to supply the tap factor to said first digital equalization device and notifying said factor computation control device that the computation by said first factor computation device is stopped if the tap factor corresponding to the status after change is stored in said memory when the status judged by said frequency information threshold device changes, and for switching said equalization factor selection device so as to supply the tap factor to said first digital equalization device and notifying said factor computation control device that the factor computation by said first factor computation device is started when the tap factor corresponding to the status after change is not stored in said memory.

* * * * *